United States Patent
Zhang et al.

(10) Patent No.: US 9,876,474 B2
(45) Date of Patent: Jan. 23, 2018

(54) DOHERTY POWER AMPLIFIER, COMMUNICATIONS DEVICE, AND SYSTEM

(71) Applicant: Huawei Technologies Co., Ltd., Shenzhen (CN)

(72) Inventors: Xiaomin Zhang, Shenzhen (CN); Yongge Su, Shenzhen (CN); Liuyan Jiao, Shenzhen (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

(21) Appl. No.: 15/202,671

(22) Filed: Jul. 6, 2016

(65) Prior Publication Data

US 2016/0315587 A1 Oct. 27, 2016

Related U.S. Application Data

(63) Continuation of application No. PCT/CN2014/070134, filed on Jan. 6, 2014.

(51) Int. Cl.
*H03F 1/02* (2006.01)
*H03F 3/195* (2006.01)
*H03F 3/60* (2006.01)
*H03F 3/24* (2006.01)
*H01L 23/66* (2006.01)

(52) U.S. Cl.
CPC .......... *H03F 1/0288* (2013.01); *H01L 23/66* (2013.01); *H03F 3/195* (2013.01); *H03F 3/245* (2013.01); *H03F 3/607* (2013.01); *H01L 2223/6611* (2013.01); *H01L 2223/6627* (2013.01); *H01L 2223/6655* (2013.01); *H03F 2200/423* (2013.01); *H03F 2200/451* (2013.01)

(58) Field of Classification Search
USPC .................. 330/295, 124 R, 286, 84, 53
See application file for complete search history.

(56) References Cited

U.S. PATENT DOCUMENTS 9,496,837 B2 * 11/2016 Qureshi .................... H03F 3/68
2005/0231278 A1 10/2005 Blednov
2009/0174482 A1 7/2009 Blednov
(Continued)

FOREIGN PATENT DOCUMENTS

CN 102142812 A 8/2011
CN 103457540 A 12/2013
(Continued)

OTHER PUBLICATIONS

Qureshi, J.H., et al., "A Wide-Band 20W LMOS Doherty Power Amplifier," 2010 IEEE MTT-S International Microwave Symposium, May 23-28, 2010, pp. 1504-1507.

*Primary Examiner* — Hieu Nguyen
(74) *Attorney, Agent, or Firm* — Slater Matsil, LLP (57) ABSTRACT

A Doherty power amplifier includes a main power amplification circuit, an auxiliary power amplification circuit, a connection circuit, and an impedance conversion circuit. An output end of the main power amplification circuit and an output end of the auxiliary power amplification circuit are connected to two ends of the connection circuit separately by using bonding wires. The output end of the auxiliary power amplification circuit is further connected to one end of the impedance conversion circuit by using a bonding wire, and the other end of the impedance conversion circuit is connected to an output load.

14 Claims, 8 Drawing Sheets

(56) References Cited

U.S. PATENT DOCUMENTS

2012/0025915 A1    2/2012   Ui
2012/0146732 A1    6/2012   Murao
2013/0169366 A1    7/2013   Deguchi et al.

FOREIGN PATENT DOCUMENTS

| | | |
|---|---|---|
| EP | 2819304 A1 | 12/2014 |
| JP | H03277005 A | 12/1991 |
| JP | 2005159598 A | 6/2005 |
| JP | 2005536922 A | 12/2005 |
| JP | 2009539277 A | 11/2009 |
| JP | 2010171650 A | 8/2010 |
| JP | 2012028880 A | 2/2012 |
| JP | 2012029239 A | 2/2012 |
| WO | 2007142414 A1 | 12/2007 |
| WO | 2008062371 A2 | 5/2008 |
| WO | 2011037274 A1 | 3/2011 |

\* cited by examiner

DOHERTY POWER AMPLIFIER, COMMUNICATIONS DEVICE, AND SYSTEM

CROSS-REFERENCE TO RELATED APPLICATIONS

This application is a continuation of International Application No. PCT/CN2014/070134, filed on Jan. 6, 2014, which is hereby incorporated by reference in its entirety.

TECHNICAL FIELD

The present invention relates to circuits and, in specific embodiments, to a Doherty power amplifier, a communications device, and a system.

BACKGROUND

A Doherty power amplifier is a highly efficient power amplifier (PA for short in this application). Generally, a Doherty power amplifier includes a carrier PA (also called a main PA) and a peak PA (also called an auxiliary PA).

Figure 1:
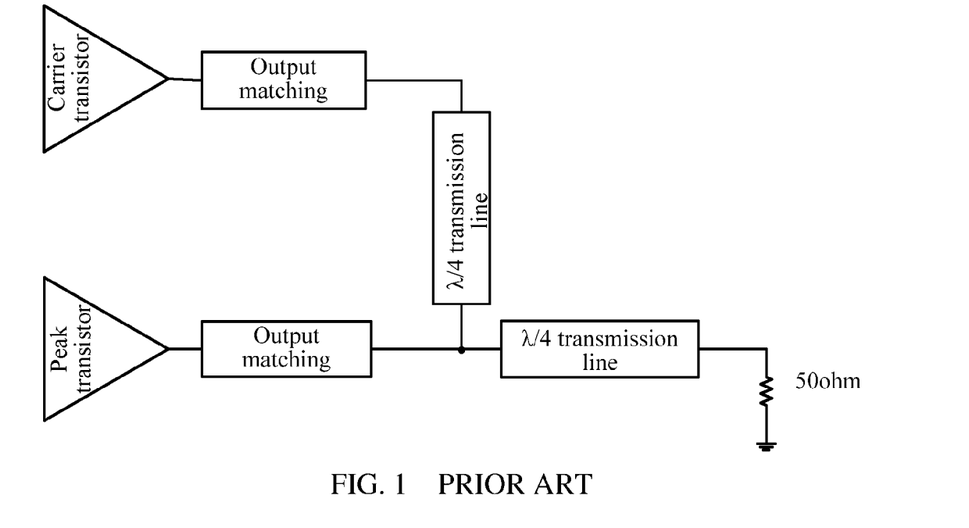
FIG. 1 shows a Doherty power amplifier in the prior art.

As shown in FIG. 1, a typical Doherty power amplifier includes a carrier power transistor (power transistor) and a peak power transistor. An output end of the carrier power transistor and an output end of the peak power transistor are connected to output matching circuits separately. An output end of the output matching circuit connected to the output end of the carrier power transistor is connected to one end of a λ/4 transmission line, and the other end of the λ/4 transmission line, after power synthesis with an output end of the output matching circuit connected to the output end of the peak power transistor, is connected to one end of another λ/4 transmission line, and the other end of the another λ/4 transmission line is connected to a transmission line, such as a 50 ohm cable.

Herein, the carrier power transistor and the peak power transistor may be power transistors of a same model, and may also be power transistors of different power levels. The carrier power transistor and the peak power transistor are generally packages of a power amplification transistor, and each the package includes an active die (die, die for short in this application), a bonding wire, and a flange. The flange is a base of a radio frequency power amplification channel; the active die is used to amplify a radio frequency signal; the bonding wire is used to connect the active die and an input end or an output end of the radio frequency power amplification channel, and the input end or the output end of the radio frequency power amplification channel is an input pin or output pin of the package. The package is connected to a peripheral circuit, such as an output matching circuit, by using the input pin or the output pin.

It can be learned from the foregoing that in a typical Doherty power amplifier, an output matching circuit and an impedance conversion circuit implemented by a λ/4 transmission line are required. However, both an area of the output matching circuit and an area of the λ/4 transmission line are relatively large, and therefore an area of the Doherty power amplifier is relatively large.

SUMMARY

The present invention provides a Doherty power amplifier, which aims to resolve a problem of how to effectively reduce an area of the Doherty power amplifier.

A first aspect provides a Doherty power amplifier, including: a main power amplification circuit, an auxiliary power amplification circuit, a connection circuit, and an impedance conversion circuit, where an output end of the main power amplification circuit and an output end of the auxiliary power amplification circuit are connected to two ends of the connection circuit separately by using bonding wires, the output end of the auxiliary power amplification circuit is further connected to one end of the impedance conversion circuit by using a bonding wire, and the other end of the impedance conversion circuit is connected to an output load.

With reference to the first aspect, in a first implementation manner of the first aspect, a parasitic capacitor (Cds) between a drain and a source of an active die in the main power amplification circuit and the connection circuit and a Cds in the auxiliary power amplification circuit form a π-type network that is used to implement an impedance conversion function.

With reference to the first aspect or the first implementation manner of the first aspect, in a second implementation manner of the first aspect, the main power amplification circuit includes a first active die (also called first die), and the auxiliary power amplification circuit includes a second active die (also called second die).

With reference to the second implementation manner of the first aspect, in a third implementation manner of the first aspect, the first die in the main power amplification circuit and the second die in the auxiliary power amplification circuit belong to power transistors of a same model.

With reference to the second implementation manner of the first aspect, in a fourth implementation manner of the first aspect, the first die in the main power amplification circuit and the second die in the auxiliary power amplification circuit belong to dies of different power levels.

With reference to the first aspect and various implementation manners of the first aspect, in a fifth implementation manner of the first aspect, the connection circuit includes a first transmission line, or the connection circuit includes multiple third transmission lines, any two of which are connected by using a bonding wire.

With reference to the first aspect and various implementation manners of the first aspect, in a sixth implementation manner of the first aspect, the impedance conversion circuit includes a second transmission line, or multiple fourth transmission lines, any two of which are connected by using a bonding wire.

With reference to the fourth, the fifth, or the sixth implementation manner of the first aspect, in a seventh implementation manner of the first aspect, an end, connected to the output end of the main power amplification circuit, of the connection circuit is connected to a fifth transmission line.

With reference to the fourth, the fifth, or the sixth implementation manner of the first aspect, in an eighth implementation manner of the first aspect, an end, connected to the output end of the main power amplification circuit, of the connection circuit is grounded by using a first capacitor or multiple first capacitors that are connected in parallel.

With reference to the first aspect and various implementation manners of the first aspect, in a ninth implementation manner of the first aspect, the Doherty power amplifier further includes a second-harmonic short-circuited circuit, where the connection circuit is grounded by using the second-harmonic short-circuited circuit, and a position at which the second-harmonic short-circuited circuit is connected to the connection circuit is determined according to a harmonic angle that the main power amplification circuit requires.

With reference to the ninth implementation manner of the first aspect, in a tenth implementation manner of the first aspect, the second-harmonic short-circuited circuit includes a λ/4 transmission line and a second capacitor that are connected in series.

With reference to the tenth implementation manner of the first aspect, in an eleventh implementation manner of the first aspect, the second-harmonic short-circuited circuit further includes a third capacitor, and the third capacitor is connected to the λ/4 transmission line and divides the λ/4 transmission line into two segments.

With reference to any one of the first to the eleventh implementation manners of the first aspect, in a twelfth implementation manner of the first aspect, the main power amplification circuit further includes a flange that matches the first die, and the auxiliary power amplification circuit further includes a flange that matches the second die.

A second aspect provides a transmitter, including the Doherty power amplifier provided in the first aspect or any one of the implementation manners of the first aspect.

A third aspect provides a base station, including the transmitter provided in the second aspect.

In embodiments of the present invention, an impedance conversion circuit is formed by directly connecting parasitic capacitors Cds between drains and sources of dies in two power transistors and a printed circuit board (PCB) transmission line, so that an output matching circuit in an existing Doherty power amplifier can be removed, thereby finally achieving an effect of reducing an area of the Doherty power amplifier.

BRIEF DESCRIPTION OF THE DRAWINGS

To describe the technical solutions in the embodiments of the present invention more clearly, the following briefly introduces the accompanying drawings required for describing the embodiments of the present invention or the prior art. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

An existing typical Doherty power amplifier includes a package, an output matching circuit, and a λ/4 transmission line, so that an area of the Doherty power amplifier is relatively large. According to a Doherty power amplifier in the embodiments of the present invention, characteristics of a die of a power transistor are used to look for a solution of how to reduce an area of the Doherty power amplifier.

Figure 2:
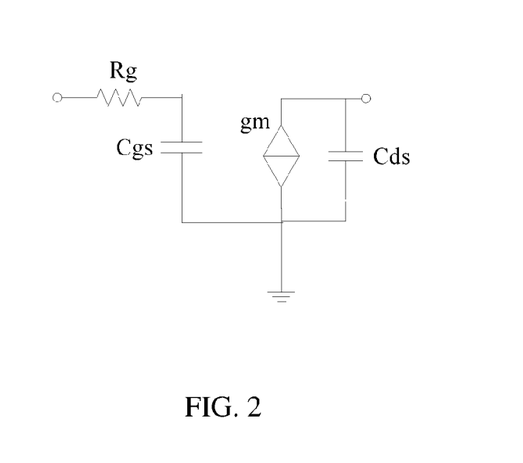
FIG. 2 shows an equivalent circuit of a die of a power transistor.

Specifically, an equivalent circuit of the die of the power transistor is shown in FIG. 2, and the die includes a gate, a drain, and a source. An Rg is a gate parasitic resistor of the die of the power transistor. A gm is transconductance of the die of the power transistor, a Cgs is a parasitic capacitor between the gate and the source of the die of the power transistor, and a Cds is a parasitic capacitor between the drain and the source of the die of the power transistor.

Figure 3A:
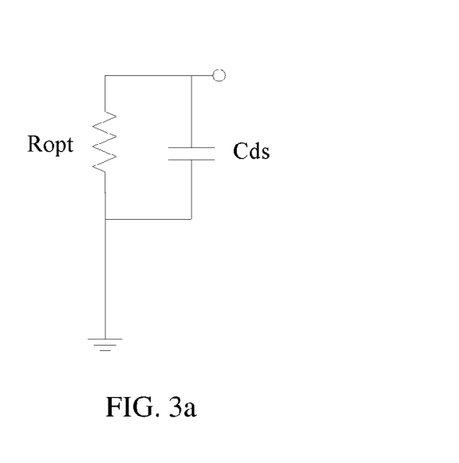
FIG. 3a shows an equivalent circuit of a die of a power transistor when the die is working.

From a viewpoint of an output end, an equivalent circuit of the die of the power transistor when the die is working is shown in FIG. 3, which is equivalent to that output impedance Ropt is connected to the Cds in parallel. Herein, the output impedance Ropt is output impedance when the power transistor is working. Generally, for a high-power transistor, output impedance is only several ohms.

Figure 3B:
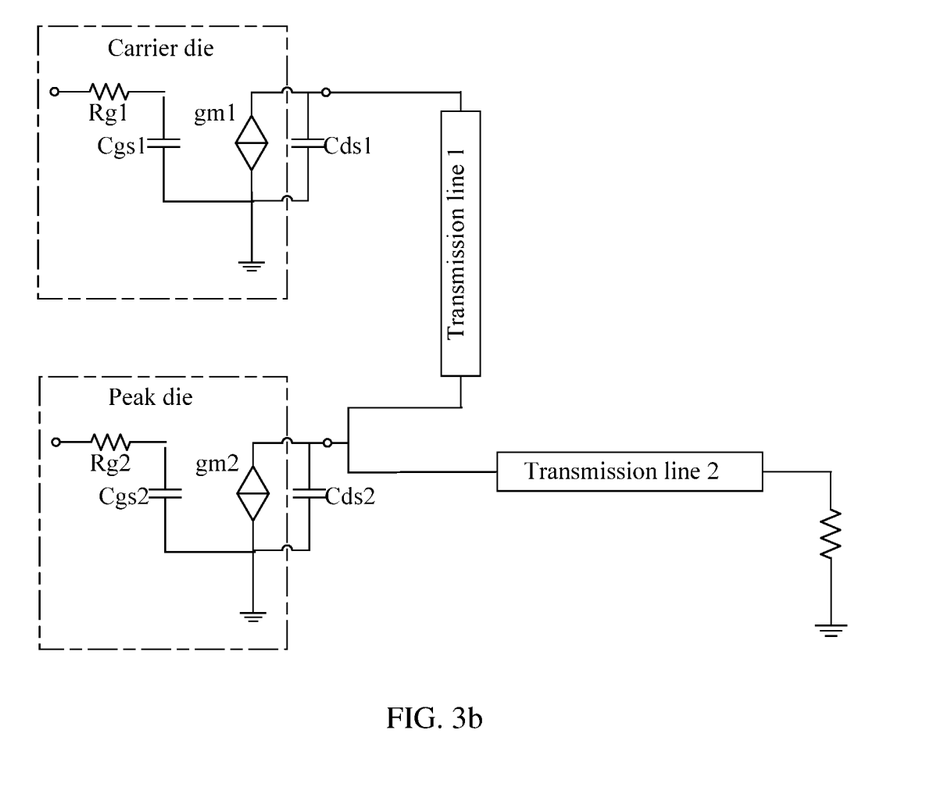
FIG. 3b shows an equivalent circuit of a Doherty power amplifier according to an embodiment of the present invention.

An existing Doherty power amplifier needs to match impedance (generally it is quite low complex impedance, such as 1+j*2 ohm) of dies of a carrier PA and a peak PA to 50 ohms, and then combine output of the carrier PA and output of the peak PA. Before the combining, generally, an impedance conversion line of a ¼ wavelength (90 degrees) is added after output matching of the carrier PA, and then power synthesis is performed for the output of the carrier PA and the output of the peak PA. In this embodiment of the present invention, Cdses of dies are used, and a π-type network (which refers to a network in which a component or a transmission line is added between two components connected in parallel) is formed by adding a transmission line to Cdses of dies of a carrier PA and a peak PA, and the π-type network implements an impedance conversion function as a whole. The Cdses of the dies of the carrier PA and the peak PA may be regarded as a part of an impedance conversion function component of an average output branch circuit, that is, die models of the carrier PA and the peak PA are equivalent to Ropt only, and therefore the carrier PA and the peak PA can be directly combined on Ropt impedance (as shown in FIG. 3a and FIG. 3b, there is no circuit element between the right side of the Cds and one end of the Ropt, which are a same point). In this way, the carrier PA and the peak PA can be combined directly on the dies, without the need to match impedance of the dies to higher impedance, such as using a 50 ohm output matching circuit, thereby reducing an area of a Doherty power amplification circuit. In addition, because a transmission line in the π-type network implements an impedance conversion function by cooperating with a Cds, compared with existing implementation of the impedance conversion function by using a ¼ wavelength transmission line, a length of the transmission line in the π-type network may be less than ¼ wavelength, which may further reduce the area of the Doherty power amplification circuit.

A Doherty power amplifier according to an embodiment of the present invention is described in detail in the following with reference to FIG. 4. The Doherty power amplifier 1 includes a main power amplification circuit 11, an auxiliary power amplification circuit 12, a connection circuit 13, and an impedance conversion circuit 14. The main power amplification circuit 11 may be a broadband main power amplification circuit, and the auxiliary power amplification circuit may also be a broadband auxiliary power amplification circuit. Broadband herein generally refers to relatively broad bandwidth, which is a relative concept. An output end of the main power amplification circuit 11 and an output end of the auxiliary power amplification circuit 12 are connected to two ends of the connection circuit 13 separately by using bonding wires 101 and 102, the output end of the auxiliary power amplification circuit 12 is further connected to one end of the impedance conversion circuit 14 by using a bonding wire 103, and the other end of the impedance conversion circuit 14 is connected to an output load 15. Generally, the bonding wires 101, 102, and 103 present inductance characteristics when frequency of an input signal of the Doherty PA are below 10 Gigahertz (GHz).

A parasitic capacitor (Cds) between a drain and a source of an active die in the main power amplification circuit and the connection circuit and a Cds in the auxiliary power amplification circuit form a π-type network that is used to implement an impedance conversion function. The impedance conversion function is a π-degree impedance conversion function, which is equivalent to a λ/4 transmission line.

The connection circuit 13 includes a transmission line. The transmission line may be a PCB transmission line, and the PCB transmission line is a transmission line based on a PCB. Main characteristics of the PCB transmission line include characteristic impedance, phase, loss, and the like. In a circuit, the PCB transmission line implements functions of signal transmission and impedance conversion. A common PCB transmission line may be implemented on a material such as a Rogers RO4350B.

Figure 4:
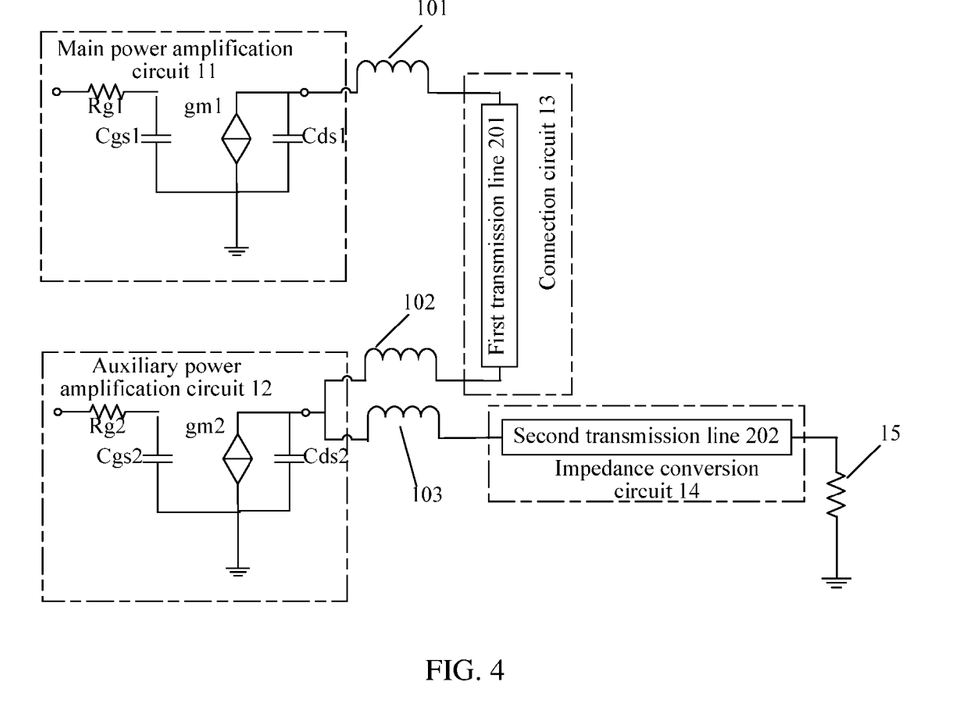
FIG. 4 shows a Doherty power amplifier according to an embodiment of the present invention.

For ease of description, FIG. 4 only schematically shows a structural diagram of the Doherty power amplifier. The main power amplification circuit 11 includes a die (a first die), the auxiliary power amplification circuit 12 includes a die (a second die), and the connection circuit 13 includes a first transmission line 201. The first transmission line 201 may be a resistive transmission line, such as a PCB transmission line. The impedance conversion circuit 14 includes a second transmission line 202, such as a PCB transmission line. The second transmission line 202 may be a λ/4 transmission line. A length of the first transmission line may be less than λ/4. Specifically, a length of the first transmission line required when the π-type network implements a 90-degree impedance conversion function as a whole may be simulated or calculated according to models shown in FIG. 3a and FIG. 3b. For a specific simulation or calculation manner, reference may be made to a manner in the prior art, which is not described herein again and is not limited. Optionally, at least one of the main power amplification circuit and the auxiliary power amplification circuit may further include a flange that is used as a base of the die.

Figure 5:
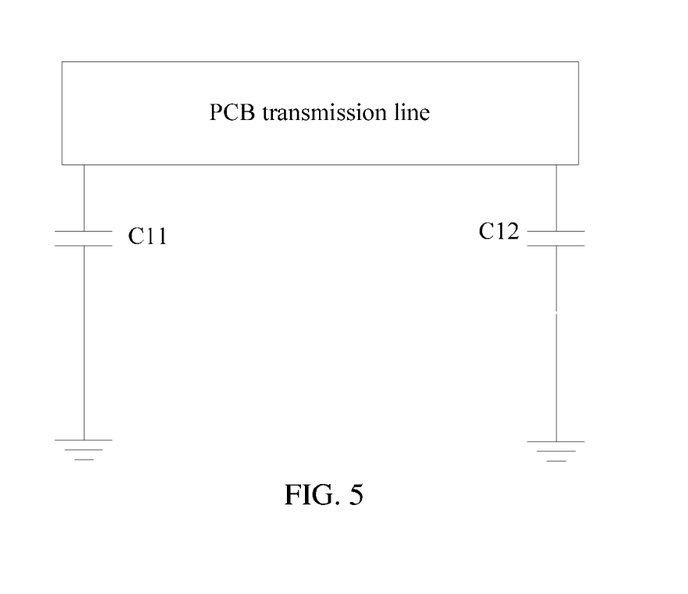
FIG. 5 shows a π-type network circuit of a ¼ wavelength (λ/4) transmission line.

A ¼ wavelength (λ/4) transmission line in the Doherty power amplifier may be replaced with the π-type network (as shown in FIG. 5), and a principle of the replacement is that the π-type network may implement a 90-degree phase shift in a case in which impedance does not change. In FIG. 5, two capacitors C11 and C12 and the PCB transmission line form the π-type network that is used as an impedance conversion structure, so that an output matching circuit that is in an existing Doherty power amplifier and is connected to a carrier power transistor and a peak power transistor is not required, and the π-type network replaces a λ/4 transmission line that is in the existing Doherty power amplifier and is connected to the carrier power transistor to implement the impedance conversion function.

In this embodiment of the present invention, the Doherty power amplifier is considered directly from a perspective of a die of a power transistor, no output matching is required for a first power transistor and a second power transistor, and power synthesis is performed directly on output impedance Ropt. A λ/4 transmission line in an existing Doherty power amplifier is replaced with a combination of a Cds1 in a die of the first power transistor, a Cds2 in a die of the second power transistor, and the first transmission line 201 in the connection circuit 13. In this way, firstly, extensive output matching can be reduced in the Doherty power amplifier in this embodiment of the present invention; secondly, a length of the first transmission line 201 does not need to be as long as λ/4, which can reduce an area.

It can be easily understood that the main power amplification circuit 11 may further include multiple first dies that are connected in parallel, and similarly, the auxiliary power amplification circuit 12 may further include multiple second dies that are connected in parallel. That the multiple first dies are connected in parallel can increase output power of the main power amplification circuit 11; similarly, that the multiple second dies are connected in parallel can increase output power of the auxiliary power amplification circuit 12. Parallel connection of the dies may be implemented by means of connections between the dies and corresponding transmission lines by using bonding lines. It may be understood that, in a main power amplification circuit, power levels of multiple dies that are connected in parallel may be selected according to an actual need. The power levels may be the same, may be different, or may be partially the same. It is the same for multiple dies that are connected in parallel in an auxiliary power amplification circuit. In addition, if necessary, at least one of the main power amplification circuit and the auxiliary power amplification circuit may further be designed as a series-parallel connection structure of dies, and dies that are connected in series are connected by using bonding wires. Power levels of the dies that are connected in series may also be selected according to an actual need. The power levels may be the same, or may be different, which is not limited herein.

In addition, the first dies in the main power amplification circuit 11 and the second dies in the auxiliary power amplification circuit 12 may belong to dies of a same model. Alternatively, the first dies in the main power amplification circuit 11 and the second dies in the auxiliary power amplification circuit 12 may belong to dies of different power levels. The number of first dies in the main power amplification circuit 11 and the number of second dies in the auxiliary power amplification circuit 12 may also be different. When at least one of the number of first dies and power level of the first dies in the main power amplification circuit 11 are the same as that of the second dies in the auxiliary power amplification circuit 12, the Doherty power amplifier is a symmetrical Doherty power amplifier. Otherwise, the Doherty power amplifier is an asymmetrical Doherty power amplifier.

Figure 6:
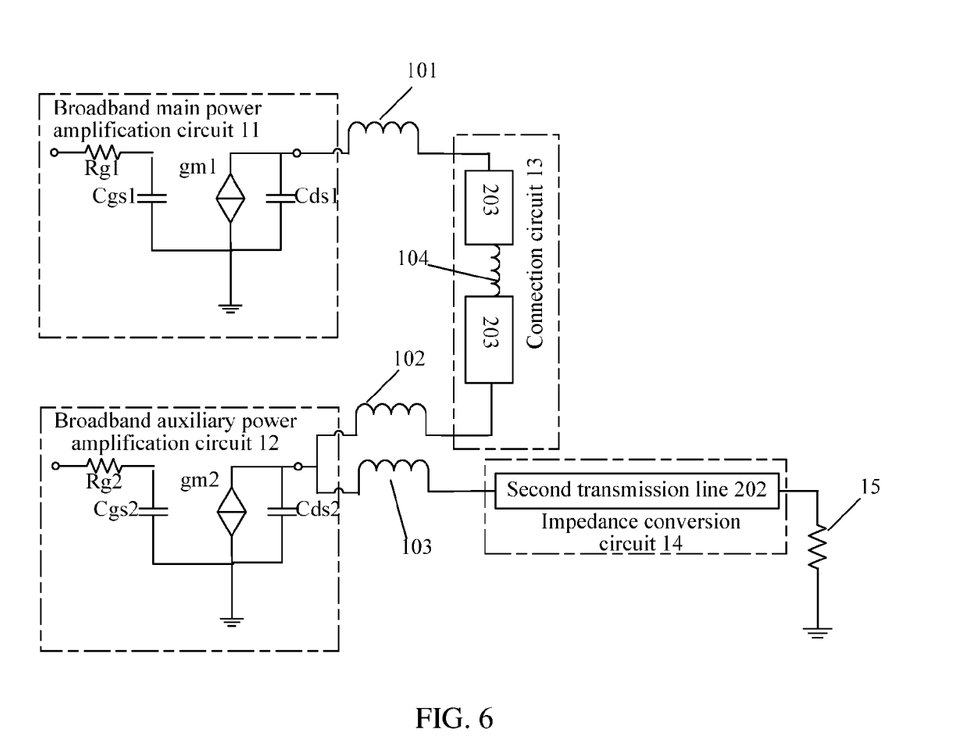
FIG. 6 shows a Doherty power amplifier according to another embodiment of the present invention.

In addition, to further reduce an area of the Doherty power amplifier, the first transmission line 201 in FIG. 4 may be divided into multiple third transmission lines 203, of which two transmission lines 203 are connected by using a bonding wire 104, as shown in FIG. 6. Similarly, the second transmission line 202 in FIG. 4 may also be divided into multiple fourth transmission lines, any two of which are connected by using a bonding wire (which is not shown). Specifically, a length of each transmission line may be designed according to an actual need, and reference may be made to a method in the prior art, which is not described herein again and is not limited.

Figure 7:
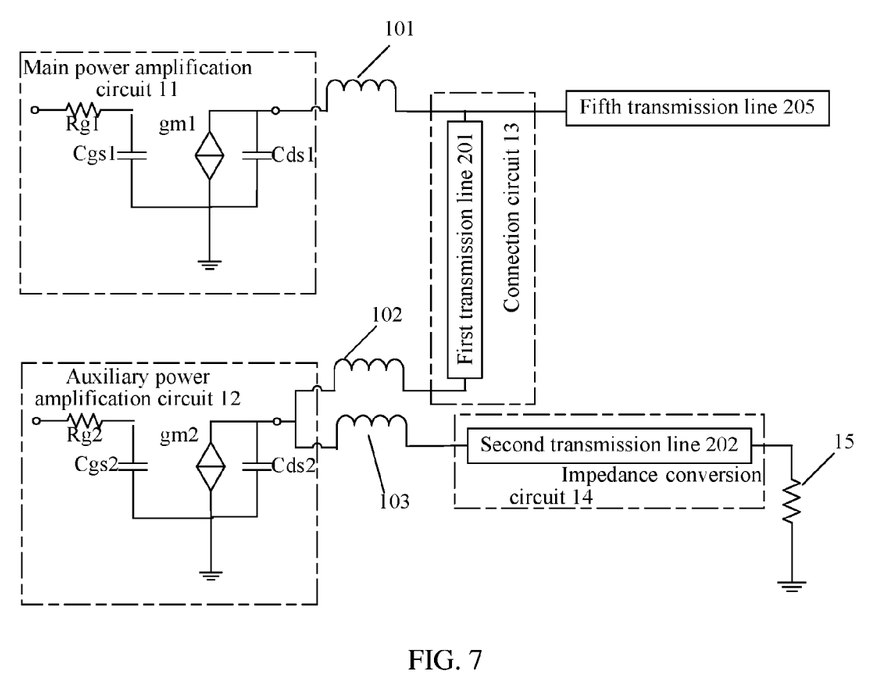
FIG. 7 shows a Doherty power amplifier according to another embodiment of the present invention.
Figure 8:
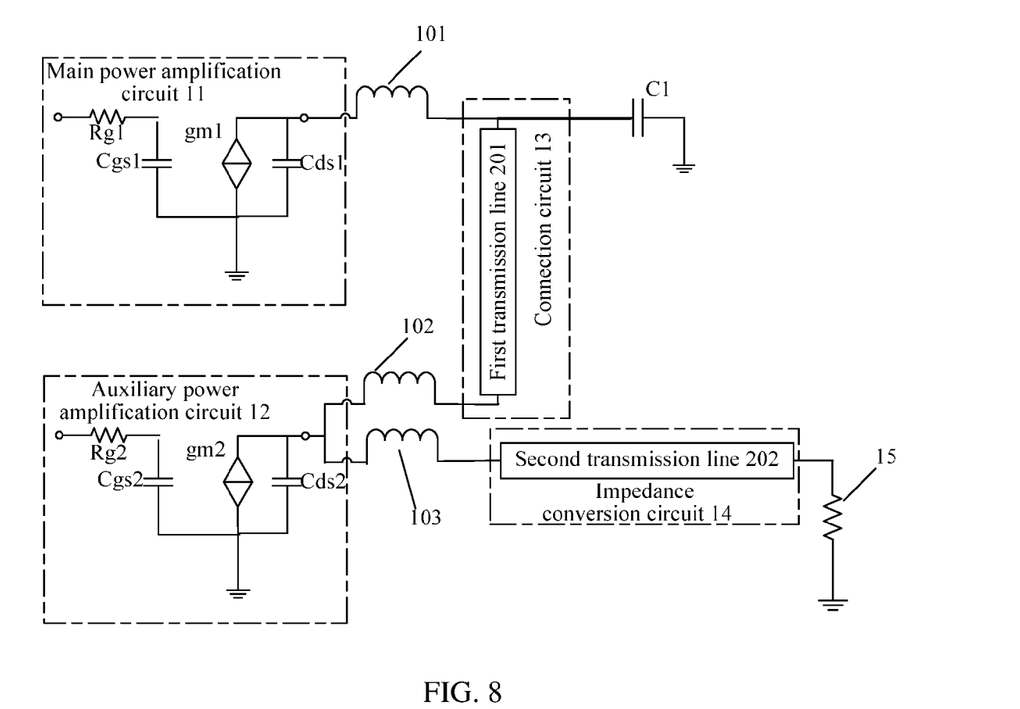
FIG. 8 shows a Doherty power amplifier according to another embodiment of the present invention.

For an asymmetrical Doherty power amplifier, because a value of the Cds1 may be less than the Cds2, it may be considered that the value of the Cds1 is compensated. For example, a fifth transmission line 205 may be connected between the bonding wire 101 and the first transmission line 201 that is in the connection circuit 13, and the other end of the fifth transmission line 205 is not connected, as shown in FIG. 7. Alternatively, for example, a first capacitor C1 may be connected between the bonding wire 101 and the first transmission line 201 that is in the connection circuit 13, and the other end of the first capacitor C1 is grounded, as shown in FIG. 8. Alternatively, multiple first capacitors C1 connected in parallel may be connected between the bonding wire 101 and the first transmission line 201 that is in the connection circuit 13, and the other ends of the first capacitors are grounded (which is not shown). Specifically, a length of each transmission line, or capacitance of each of the first capacitors may be designed according to an actual need, and reference may be made to a method in the prior art, which is not described herein again and is not limited.

Further, the Doherty power amplifier in this embodiment of the present invention may further include a second-harmonic short-circuited circuit 16. The connection circuit 13 is grounded by using the second-harmonic short-circuited circuit 16, and a position at which the second-harmonic short-circuited circuit 16 is connected to the connection circuit 13 is determined according to a harmonic angle that the main power amplification circuit 11 requires, and reference may be made to a manner in the prior art, which is not described herein again and is not limited. For example, a second-harmonic short circuit state is required for a die of a power transistor, and then a circuit phase from the second-harmonic short-circuited circuit to the die of the power transistor is required to exactly enable the die of the power transistor to be in a short-circuited state in an output direction.

Figure 9:
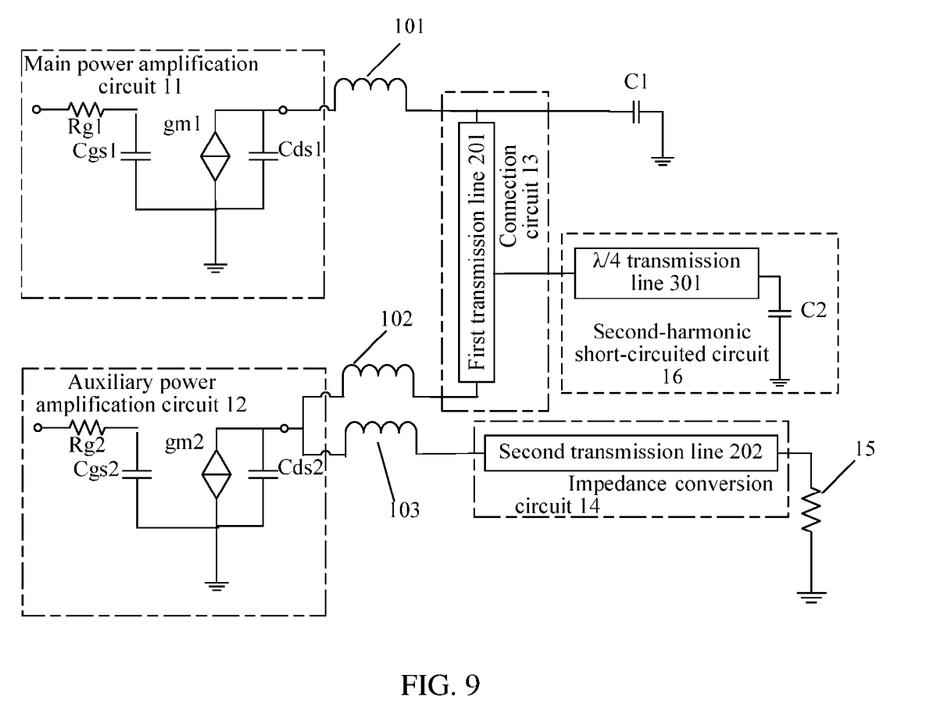
FIG. 9 shows a Doherty power amplifier according to another embodiment of the present invention.

In an implementation manner, the second-harmonic short-circuited circuit 16 may include a serial connection part: a $\lambda/4$ transmission line 301 and a second capacitor C2, and the other end of the serial connection part is grounded, as shown in FIG. 9.

Figure 10:
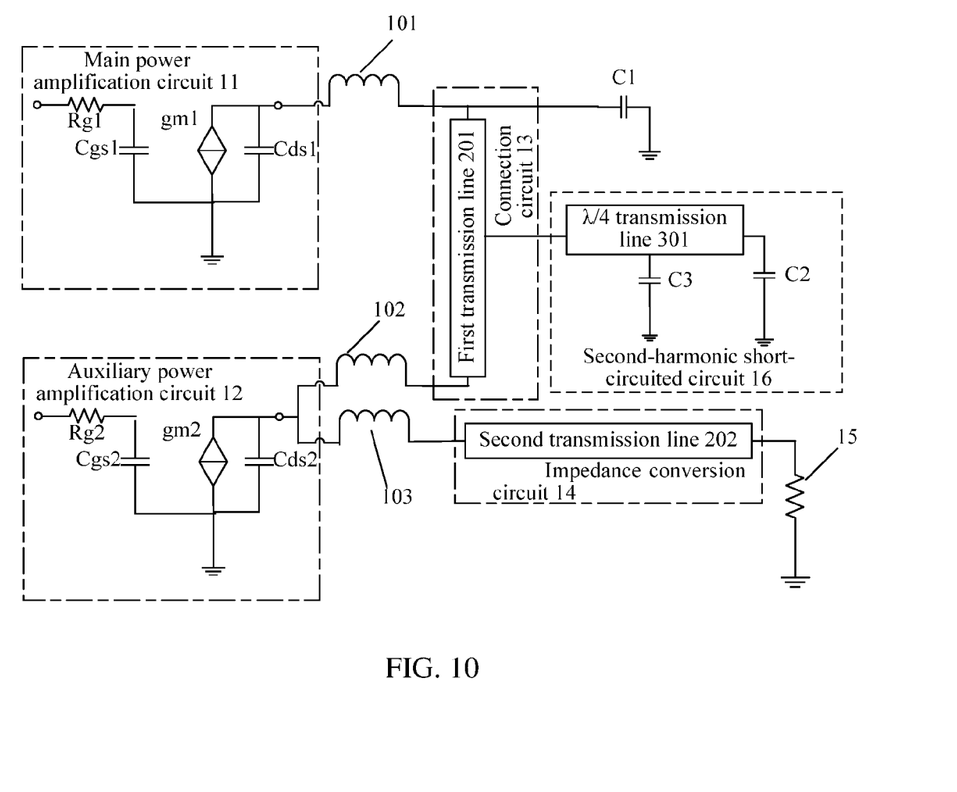
FIG. 10 shows a Doherty power amplifier according to another embodiment of the present invention.

Alternatively, in another implementation manner, the second-harmonic short-circuited circuit 16 may include a serial connection part: a $\lambda/4$ transmission line 301 and a second capacitor C2, where the other end of the serial connection part is grounded, and a third capacitor C3, where the $\lambda/4$ transmission line 301 is grounded by using the third capacitor C3. As shown in FIG. 10, the third capacitor C3 is connected to the $\lambda/4$ transmission line 301, and a connection point of the third capacitor C3 divides the $\lambda/4$ transmission line 301 into two segments. In this implementation manner, the third capacitor C3 can shorten a length of the $\lambda/4$ transmission line 301, thereby reducing an area occupied by the second-harmonic short-circuited circuit 16. Specifically, capacitance of the capacitor may be designed according to an actual need, and reference may be made to a method in the prior art, which is not described herein again and is not limited.

In this way, the second-harmonic short-circuited circuit 16 enables the Doherty power amplifier in this embodiment of the present invention to implement second-harmonic short circuiting and implement power supply at the same time.

In this embodiment of the present invention, an impedance conversion circuit is formed by directly connecting parasitic capacitors Cds between drains and sources of dies in two power transistors and a transmission line, so that an output matching circuit in an existing Doherty power amplifier can be removed, thereby finally achieving an effect of reducing an area of the Doherty power amplifier.

An embodiment of the present invention further provides a transmitter, and the transmitter includes any one of the Doherty power amplifiers provided in the foregoing embodiments. The transmitter may be applied to the field of wireless communications, and may also be applied to a radar system.

An embodiment of the present invention provides a communications device that includes the foregoing transmitter, and the communications device may be a base station. A radio access technology (RAT, radio access technology) of the base station may not be limited.

In the embodiments of the present invention, "multiple" refers to the meaning of at least two.

It should be understood that a solution described in each claim of the present invention should also be regarded as an embodiment, and characteristics in claims can be combined. For example, steps of different branches executed after determining steps in the present invention can be used as different embodiments.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some characteristics may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of the present invention essentially, or the part contributing to the prior art, or a part of the technical solutions may be implemented in a form of a software product. The software product is stored in a storage medium, and includes several instructions for instructing a computer device (which may be a personal computer, a server, or a network device) to perform all or a part of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A Doherty power amplifier, comprising:
a main power amplification circuit;
an auxiliary power amplification circuit;
a connection circuit, wherein a first end of the connection circuit is connected an output end of the main power amplification circuit by a first bonding wire and a second end of the connection circuit is connected an output end of the auxiliary power amplification circuit by a second bonding wire;
a first capacitor, wherein a first end of the first capacitor is connected to the first end of the connection circuit, and a second end of the first capacitor is connected to a ground node, and wherein the first capacitor has a capacitance that is independent of the main power amplification circuit;
an impedance conversion circuit, wherein a first end of the impedance conversion circuit is connected to the output end of the auxiliary power amplification circuit by a third bonding wire and a second end of the impedance conversion circuit is configured to be connected to an output load; and
a second-harmonic short-circuited circuit, wherein the connection circuit is grounded by using the second-harmonic short-circuited circuit, and a position at which the second-harmonic short-circuited circuit is connected to the connection circuit is determined according to a harmonic angle of the main power amplification circuit.

2. The Doherty power amplifier according to claim 1, wherein a parasitic capacitance between a drain and a source of an active die in the main power amplification circuit and the connection circuit and a parasitic capacitance in the auxiliary power amplification circuit form a π-type network that performs an impedance conversion function.

3. The Doherty power amplifier according to claim 1, wherein the main power amplification circuit comprises a first active die and the auxiliary power amplification circuit comprises a second active die.

4. The Doherty power amplifier according to claim 3, wherein the first active die in the main power amplification circuit and the second active die in the auxiliary power amplification circuit belong to power transistors of a same model.

5. The Doherty power amplifier according to claim 3, wherein the first active die in the main power amplification circuit and the second active die in the auxiliary power amplification circuit are dies of different power levels.

6. The Doherty power amplifier according to claim 5, wherein the first capacitor is one of a plurality of capacitors that are connected in parallel.

7. The Doherty power amplifier according to claim 3, wherein the main power amplification circuit further comprises a flange that matches the first active die, and wherein the auxiliary power amplification circuit further comprises a flange that matches the second active die.

8. The Doherty power amplifier according to claim 1, wherein the connection circuit comprises a transmission line.

9. The Doherty power amplifier according to claim 1, wherein the impedance conversion circuit comprises a transmission line.

10. The Doherty power amplifier according to claim 1, wherein the second-harmonic short-circuited circuit comprises a $\lambda/4$ transmission line and a second capacitor that are connected in series.

11. The Doherty power amplifier according to claim 10, wherein the second-harmonic short-circuited circuit further comprises a third capacitor that is connected to the $\lambda/4$ transmission line and divides the $\lambda/4$ transmission line into two segments.

12. A transmitter, comprising a Doherty power amplifier, wherein the Doherty power amplifier comprises a main power amplification circuit, an auxiliary power amplification circuit, a connection circuit, an impedance conversion circuit, and a second-harmonic short-circuited circuit; and
wherein an output end of the main power amplification circuit and an output end of the auxiliary power amplification circuit are connected to two ends of the connection circuit using separate bonding wires, the output end of the auxiliary power amplification circuit is further connected to a first end of the impedance conversion circuit by using a bonding wire, and a second end of the impedance conversion circuit is connected to an output load; and
wherein the connection circuit is grounded by using the second-harmonic short-circuited circuit, and wherein a position at which the second-harmonic short-circuited circuit is connected to the connection circuit is determined according to a harmonic angle of the main power amplification circuit.

13. The Doherty power amplifier according to claim 12, wherein the second-harmonic short-circuited circuit comprises a $\lambda/4$ transmission line and a second capacitor that are connected in series.

14. The Doherty power amplifier according to claim 13, wherein the second-harmonic short-circuited circuit further comprises a third capacitor that is connected to the $\lambda/4$ transmission line and divides the $\lambda/4$ transmission line into two segments.

* * * * *